(12) United States Patent
Yagi

(10) Patent No.: US 8,168,983 B2
(45) Date of Patent: May 1, 2012

(54) SEMICONDUCTOR DEVICE, METHOD FOR MANUFACTURING SEMICONDUCTOR DEVICE, DISPLAY DEVICE, AND METHOD FOR MANUFACTURING DISPLAY DEVICE

(75) Inventor: Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 265 days.

(21) Appl. No.: 12/667,972

(22) PCT Filed: Jul. 1, 2008

(86) PCT No.: PCT/JP2008/061919
§ 371 (c)(1),
(2), (4) Date: Jan. 6, 2010

(87) PCT Pub. No.: WO2009/011220
PCT Pub. Date: Jan. 22, 2009

(65) Prior Publication Data
US 2011/0012198 A1    Jan. 20, 2011

(30) Foreign Application Priority Data

Jul. 13, 2007 (JP) ................................ 2007-184172

(51) Int. Cl.
*H01L 27/14* (2006.01)
*H01L 21/00* (2006.01)
*H01L 21/84* (2006.01)

(52) U.S. Cl. ..... 257/72; 438/99; 438/151; 257/E51.005; 257/40; 257/E51.006; 257/E21.414; 257/E21.413

(58) Field of Classification Search ............. 257/E29.29, 257/E29.291, 40, 72, 59, E51.006, E51.005, 257/E29.11, E29.116, E29.117, E29.137, 257/E21.04, E21.414, E21.413; 438/99, 438/151, 158, FOR. 200, 149; 349/42, 43, 349/46
See application file for complete search history.

(56) References Cited

U.S. PATENT DOCUMENTS
2006/0081849 A1* 4/2006 Lee et al. ........................ 257/72
(Continued)

FOREIGN PATENT DOCUMENTS
EP    2136244 A1 * 12/2009
(Continued)

OTHER PUBLICATIONS

International Search Report dated Sep. 30, 2008.
(Continued)

*Primary Examiner* — Matthew Landau
*Assistant Examiner* — Latanya N Crawford
(74) *Attorney, Agent, or Firm* — SNR Denton US LLP

(57) ABSTRACT

A semiconductor device 19-1 includes a source electrode 3s and a drain electrode 3d disposed on a substrate 1, an insulating partition wall 5, which has a first opening 5a reaching end portions of the source electrode 3s and the drain electrode 3d and between these electrodes 3s-3d and which is disposed on the substrate 1, a channel portion semiconductor layer 7a, which is composed of a semiconductor layer 7 formed from above the partition wall 5 and which is disposed on the bottom portion of the first opening 5a while being separated from the semiconductor 7 on the partition wall 5, a gate insulating film 9 formed all over the surface from above the semiconductor layer 7 including the channel portion semiconductor layer 7a, and a gate electrode 11a disposed on the gate insulating film 9 while overlapping the channel portion semiconductor layer 7a.

10 Claims, 14 Drawing Sheets

U.S. PATENT DOCUMENTS

| | | | |
|---|---|---|---|
| 2007/0023837 A1* | 2/2007 | Lee et al. | 257/347 |
| 2007/0158744 A1 | 7/2007 | Song et al. | |
| 2007/0278493 A1* | 12/2007 | Sato | 257/72 |
| 2008/0111130 A1* | 5/2008 | Okuyama | 257/40 |
| 2008/0143251 A1* | 6/2008 | Mathea et al. | 313/504 |
| 2008/0246089 A1* | 10/2008 | Ko et al. | 257/347 |
| 2008/0265442 A1* | 10/2008 | Yagi | 257/786 |
| 2009/0026445 A1* | 1/2009 | Noh et al. | 257/40 |
| 2009/0309103 A1* | 12/2009 | Yagi | 257/72 |
| 2011/0012097 A1* | 1/2011 | Yoneya | 257/40 |
| 2011/0042656 A1* | 2/2011 | Burroughes et al. | 257/40 |

FOREIGN PATENT DOCUMENTS

| | | |
|---|---|---|
| JP | 08-330597 | 12/1996 |
| JP | 2000-269504 | 9/2000 |
| JP | 2002-518844 | 6/2002 |
| JP | 2005-086147 | 3/2005 |
| JP | 2006-114862 | 4/2006 |
| JP | 2007-140520 | 6/2007 |
| JP | 2007-150240 | 6/2007 |
| JP | 2007-220713 | 8/2007 |
| WO | WO 2008122780 A2 * | 10/2008 |

OTHER PUBLICATIONS

Stijn De Vusser et al.; Integrated shadow mask method for patterning small molecule organic semiconductors; Applied Physics Letters 88; p, 103501; Mar. 7, 2006.

Supplementary European Search Report dated Oct. 21, 2011 in connection with counterpart EP Application No. EP 08 79 0782.

* cited by examiner

FIG. 1
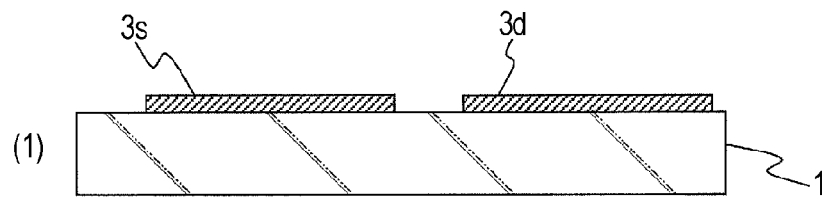
(1)
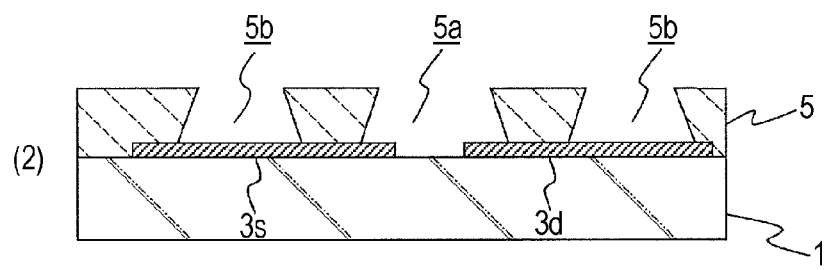
(2)
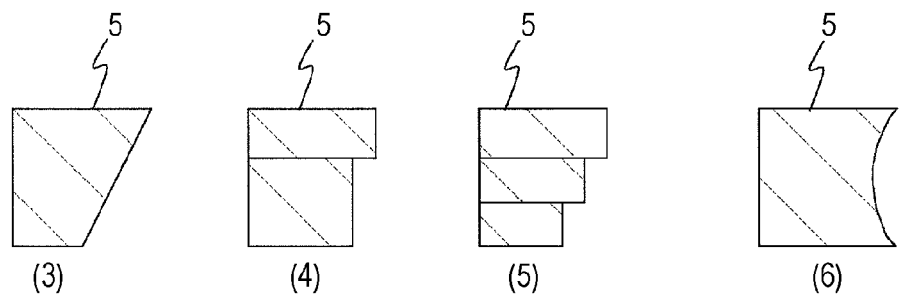
(3) (4) (5) (6)
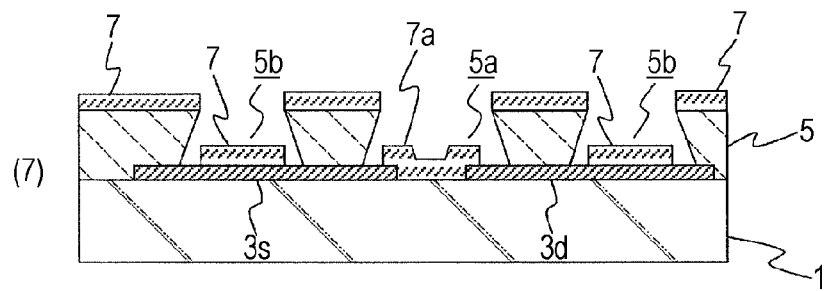
(7)

FIG. 6
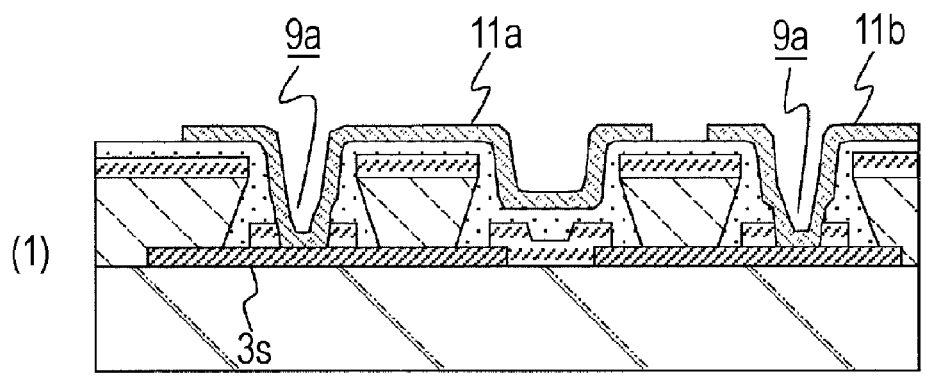
(1)
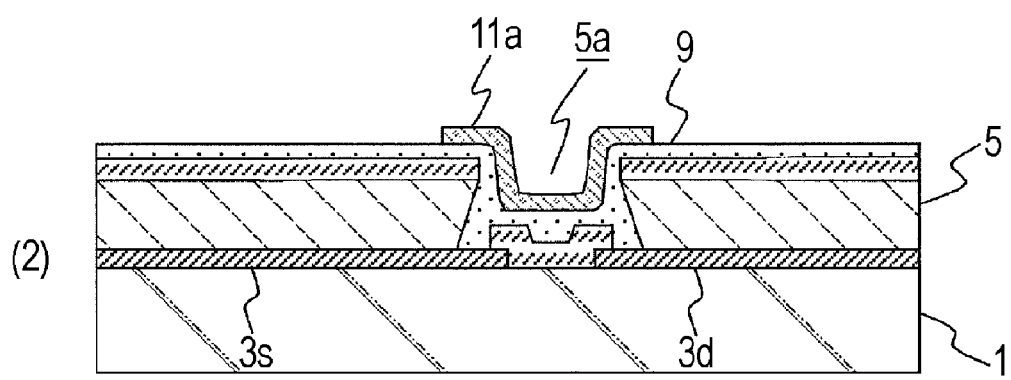
(2)

FIG. 7
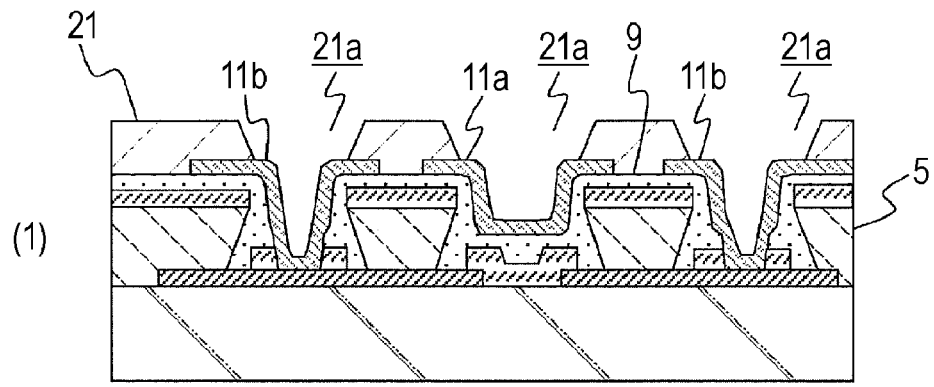
(1)
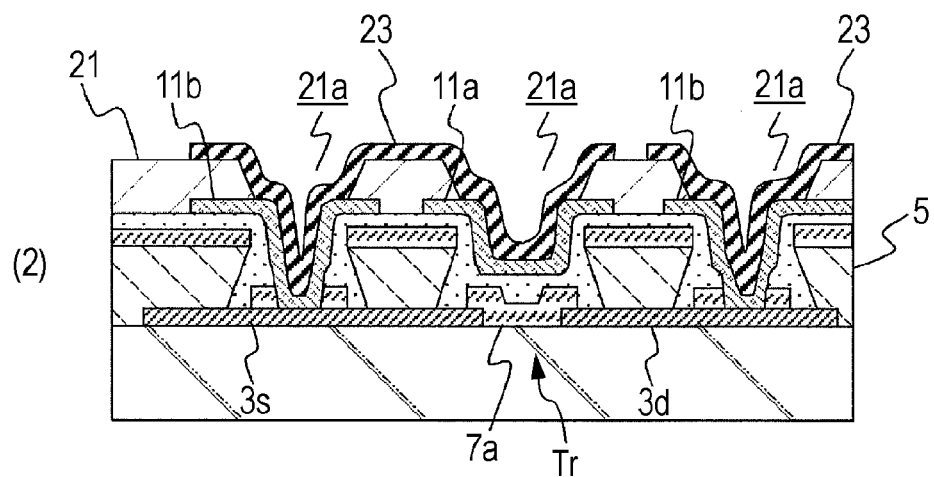
(2)
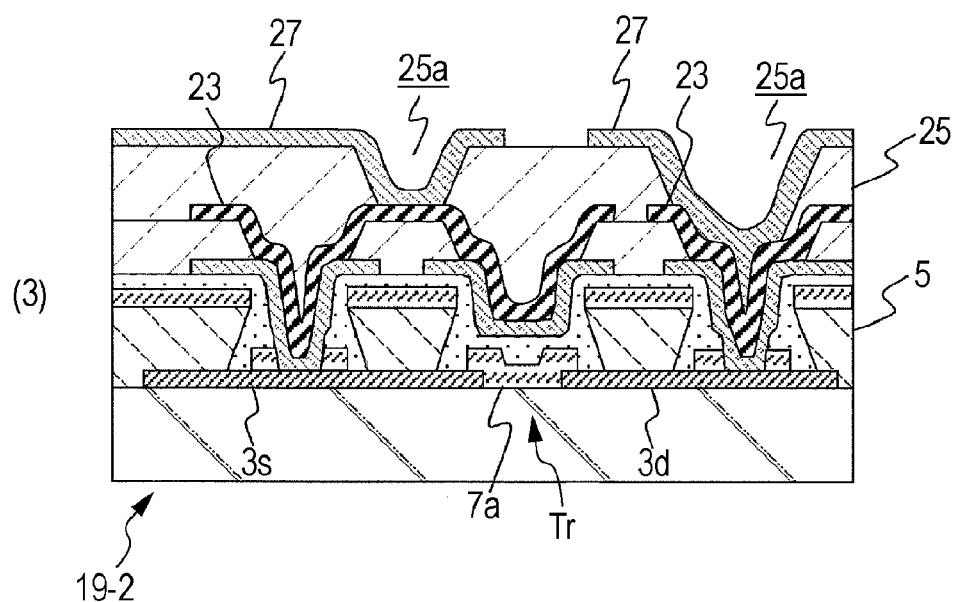
(3)

FIG. 8
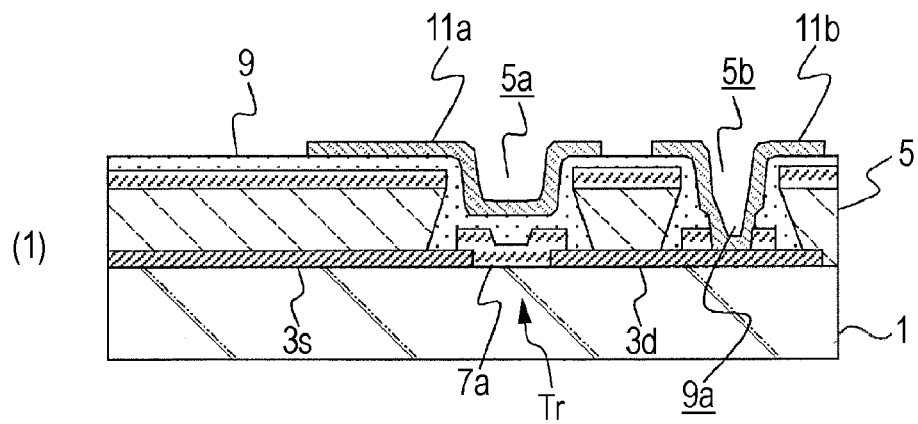
(1)
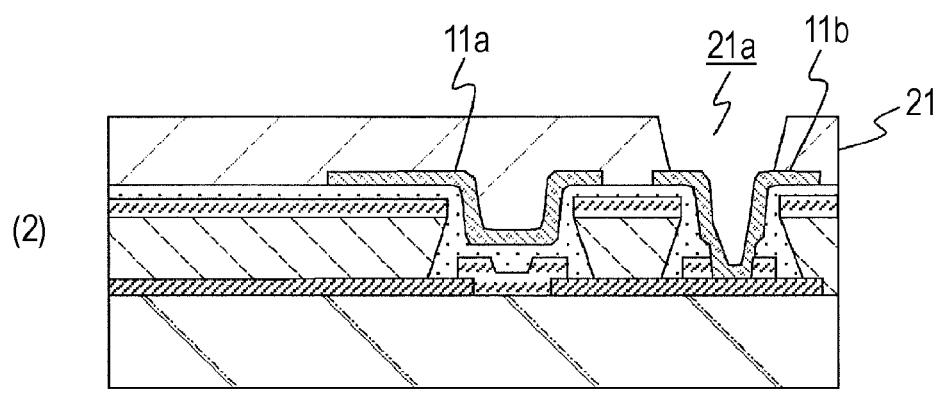
(2)
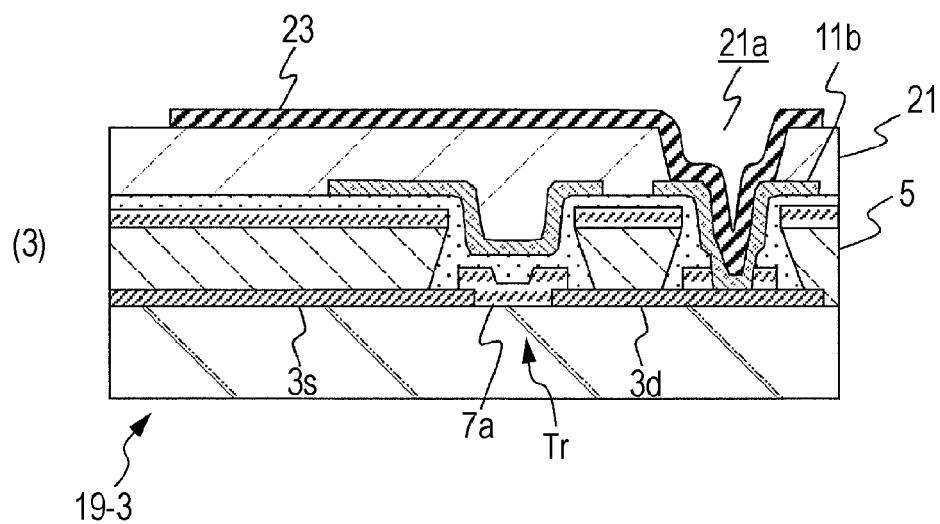
(3)

FIG. 11
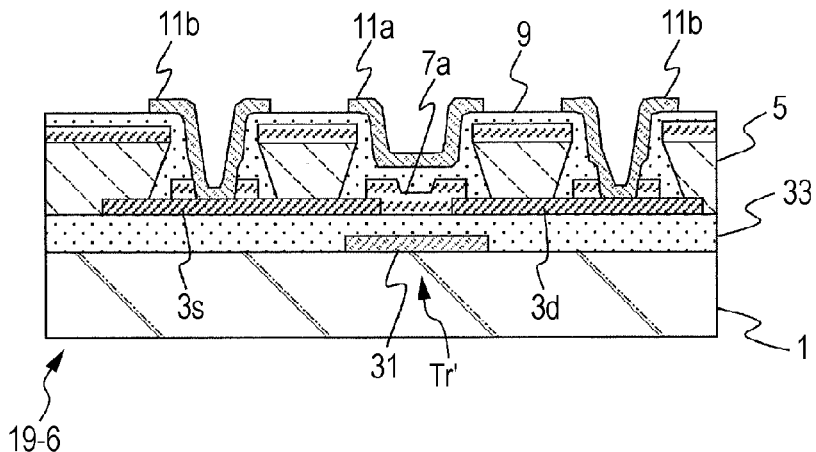
FIG. 12
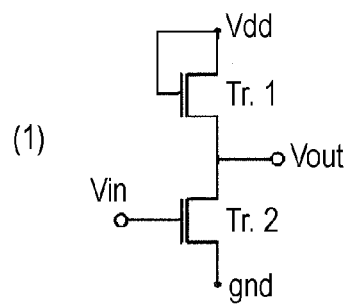
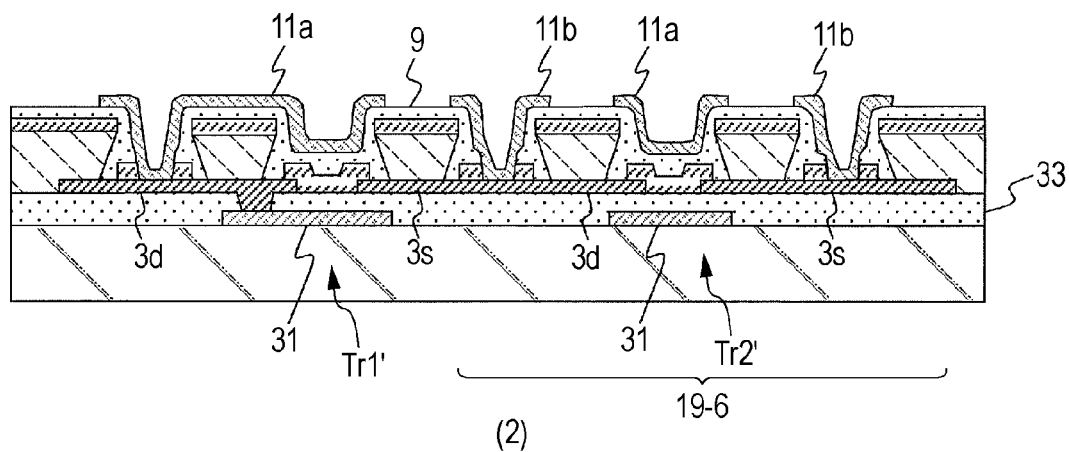

US 8,168,983 B2

SEMICONDUCTOR DEVICE, METHOD FOR MANUFACTURING SEMICONDUCTOR DEVICE, DISPLAY DEVICE, AND METHOD FOR MANUFACTURING DISPLAY DEVICE

TECHNICAL FIELD

The present invention relates to, in particular, a semiconductor device provided with a finely patterned thin film semiconductor layer, a method for manufacturing the semiconductor device, and furthermore, a display device including this semiconductor device, and a method for manufacturing the display device.

BACKGROUND ART

A thin film transistor (thin film transistor) has been used widely as a pixel transistor in an electronic circuit, in particular, an active matrix drive flat type display device. In recent years, it has been noted that an organic material is used for a semiconductor layer used in such a low-profile semiconductor device. Regarding a thin film transistor, in which the organic material is used for a semiconductor layer, that is, an organic thin film transistor (Organic Thin Film Transistor: OTFT), the semiconductor layer can be formed at low temperatures as compared with a configuration, in which an inorganic material is used for a semiconductor layer. Consequently, there is an advantage to increase an area. In addition, formation can be conducted on a flexible substrate, e.g., plastic, exhibiting poor heat resistance, and cost reduction as well as expansion in functionality are expected.

It is advantageous for size reduction that the above-described organic thin film transistor is of top gate type, in which a source electrode, a drain electrode, and a semiconductor layer are disposed on a substrate, and a gate electrode is disposed on a gate insulating film covering them. This is because formation of the source/drain electrodes is conducted on a flat substrate surface, in which a base material has no unevenness, and thereby, the distance between the source electrode-drain electrode can be controlled with high accuracy and a thin film transistor having good transistor characteristics can be obtained even in the case where the source/drain electrodes are formed by applying a printing method through the use of a coating-based material.

In production of the above-described top gate type organic thin film transistor, for example, a partition wall provided with an opening portion, which exposes the portion between the source electrode-drain electrode, is disposed on the substrate provided with the source/drain electrodes. Subsequently, an organic semiconductor layer and a gate insulating film are patterned sequentially in the opening portion of the partition wall by a printing method, e.g., ink jet, and a gate electrode and a gate wiring disposed extending from the gate electrode are further formed on the gate insulating film and the partition wall. Moreover, regarding a display device including a top gate type organic thin film transistor as a pixel transistor, a protective film is formed while covering the organic thin film transistor, and the pixel electrode is led to the protective film so as to conduct wiring (up to this point, refer to Patent Document 1 described below).

Regarding the display device including the above-described top gate type organic thin film transistor, the potential of the pixel electrode wired overlapping the thin film transistor does not have an influence on the organic semiconductor layer. Consequently, the organic thin film transistor can be operated stably. The same holds with respect to a semiconductor device, in which an upper layer wiring is formed through lamination on a top gate type organic thin film transistor, besides the display device.

Patent Document 1: Japanese Unexamined Patent Application Publication No. 2006-114862 (refer to, in particular, FIG. 2 and parts of related description)

DISCLOSURE OF INVENTION

However, all organic semiconductor materials are not formed through ink jet. In some cases, vacuum evaporation is used as a common method for forming a film of an organic semiconductor material. In the case where a vacuum evaporation method is used, a metal mask may be used for pattern film formation of a semiconductor layer. In this case, it has been difficult to conduct patterning on a substrate having a large area with good accuracy of position. Furthermore, in the case where a resist pattern is formed on the shape of an organic semiconductor layer and etching is conducted, the resist in itself and a resist release solution used for removing the resist pattern damages the organic semiconductor layer and, therefore, there is a problem in that deterioration of the semiconductor characteristics, e.g., an increase in leakage current in the organic semiconductor layer, a reduction in the mobility, and a shift of the threshold value, accompanies.

Moreover, in the display device including the thin film transistor, other elements, e.g., a capacitive element, which are the same constituents as the thin film transistor, are disposed. Consequently, a gate insulating film may be formed as a constituent of other elements all over the surface including the organic semiconductor layer and an upper part of the partition wall. In addition, the gate insulating film may be used as an interlayer insulating film in a part other than the thin film transistor. In this case, it is necessary that the gate insulating film is grown on a surface, on which various material layers, e.g., a semiconductor layer and other insulating films, are present together. However, growth of a thin film, e.g., a gate insulating film, on a semiconductor layer formed from an organic material is in the course of development because, for example, the number of materials therefor is small. Therefore, regarding the gate insulating film formed on the above-described surface, on which various material layers including the semiconductor layer formed from the organic material are present together, the insulating property is different locally, and short-circuit between metals may be caused, for example.

Accordingly, it is an object of the present invention to provide a semiconductor device provided with a gate insulating film formed uniformly together with a fine semiconductor layer, wherein the element structure is thereby made finer and the reliability is improved and a method for manufacturing the semiconductor device, and further provide a display device, wherein high-definition display can be conducted by using this semiconductor device and the reliability is improved and a method for manufacturing the display device.

In order to achieve the above-described object, regarding a semiconductor device according to the present invention, a source electrode and a drain electrode are disposed on a substrate and, furthermore, an insulating partition wall is disposed, which has a first opening between the source electrode and the drain electrode, the first opening reaching the substrate, and second openings at the center portion of the source electrode and the center portion of the drain electrode, the second openings reaching the source electrode and the drain electrode. Moreover, a channel portion semiconductor layer is disposed on the bottom portion of the first opening. Then, a gate insulating film is disposed on the partition wall in such a way as to cover the first opening including the channel portion semiconductor layer and the second openings and a gate electrode is disposed on the gate insulating film while overlapping this channel portion semiconductor layer. In addition, a semiconductor layer is disposed on the partition wall.

In the semiconductor device having the above-described configuration, the channel portion semiconductor layer is disposed in a lower part of the partition wall and, furthermore, the semiconductor layer is disposed in an upper part of the partition wall. Consequently, these semiconductor layers are formed while being finely separated and patterned through film formation from above the partition wall. Most of the gate insulating film formed in this upper part is disposed on the semiconductor layer including the channel portion semiconductor layer and, therefore, is formed on the same base material with uniform film quality.

Furthermore, regarding a display device according to the present invention, the configuration of the above-described semiconductor device of the present invention is provided with an interlayer insulating film covering the gate insulating film and the gate electrode. Moreover, pixel electrodes connected to the source electrode or the drain electrode through the connection holes disposed in the second openings are disposed on this interlayer insulating film while insulation from the semiconductor layer on the partition wall is maintained.

In such a display device, the pixel electrode on the interlayer insulating film is disposed while insulation from the semiconductor layer, which is disposed in the state of remaining all over the partition wall, is maintained. In addition, in the case where the pixel electrode is formed from a reflective material, the display light reflected at the pixel electrode can be taken out without being affected by the semiconductor layer under this pixel electrode.

Furthermore, the present invention also relates to a method for manufacturing a semiconductor device having such a configuration and a method for manufacturing a display device, as well as methods, in which the above-described individual members are formed on a substrate sequentially from the source electrode side and the drain electrode side. Moreover, in particular, in the formation of the channel portion semiconductor layer, film formation of the semiconductor layer is conducted from above the partition wall and, thereby, the channel portion semiconductor layer composed of the semiconductor layer is formed on the bottom portion of the first opening in such a way as to be separated from the top of the partition wall.

As is described above, according to the present invention, the finely separated and patterned channel portion semiconductor layer is provided through film formation from above the partition wall without employing a lithography method. Therefore, the element structure can be made finer. In addition, since the gate insulating film is provided through uniform film formation, leakage from the wiring and the gate electrode disposed above the gate insulating film or between the electrically conductive layers disposed on and under the gate insulating film is prevented, and the reliability of the semiconductor device can be improved. Furthermore, the footprint of the pixel is reduced by the configuration in which the pixel electrode is connected to the element made finer, as described above, and high-definition display is made possible and, in addition, a display device with high reliability can be realized.

BRIEF DESCRIPTION OF DRAWINGS

FIG. 1 is a sectional step diagram (No. 1) for explaining a first example of an embodiment related to a semiconductor device.

FIG. 6 is a sectional view showing a modified example of the first example of the embodiment related to the semiconductor device.

FIG. 7 is a sectional step diagram for explaining a second example of the embodiment related to the semiconductor device.

FIG. 8 is a sectional step diagram for explaining a third example of the embodiment related to the semiconductor device.

FIG. 11 is a sectional step diagram for explaining a sixth example of the embodiment related to the semiconductor device.

FIG. 12 is a diagram for explaining the configuration of an inverter circuit, to which the semiconductor device in sixth example is applied.

BEST MODES FOR CARRYING OUT THE INVENTION

Figure 2:
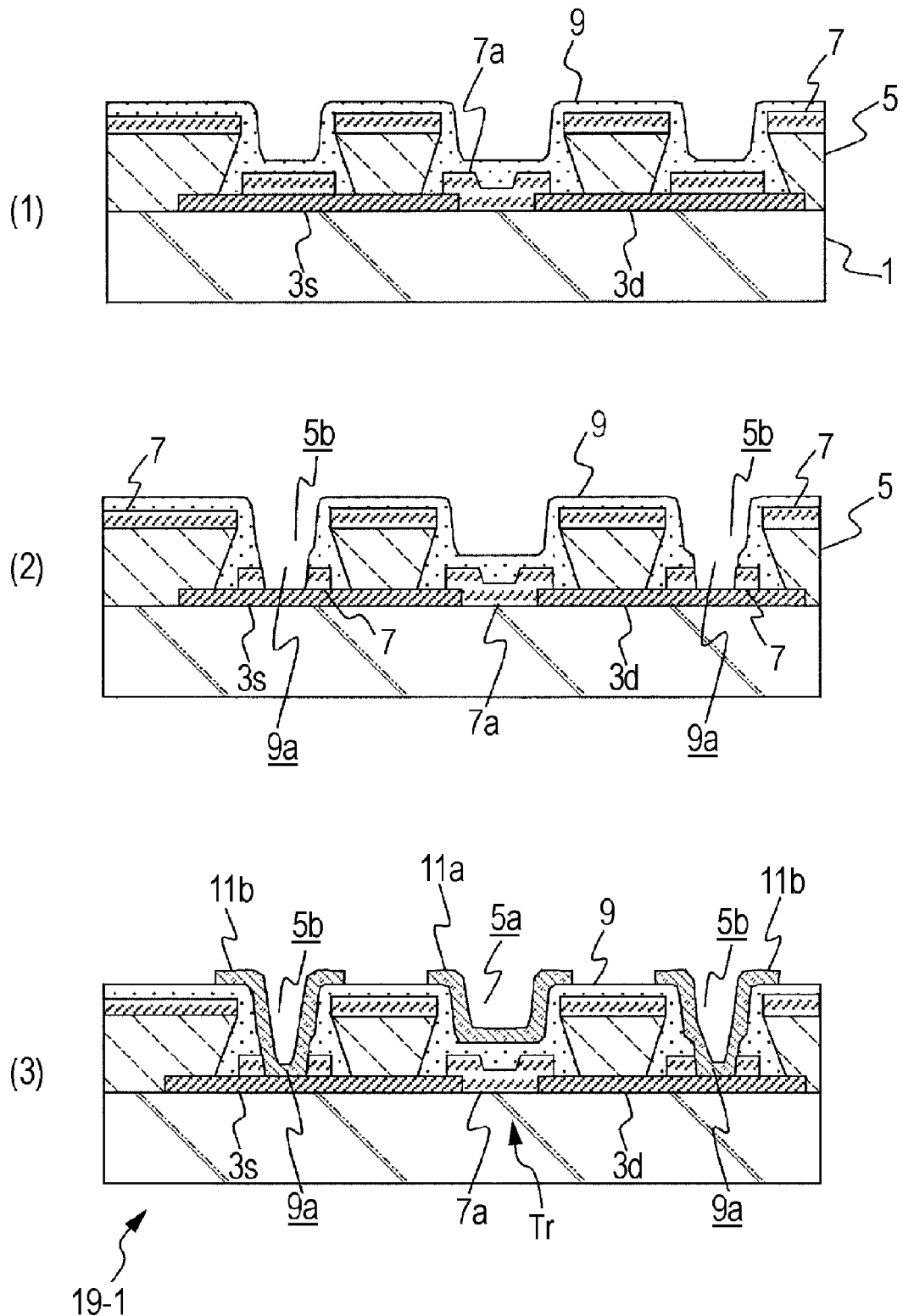
FIG. 2 is a sectional step diagram (No. 2) for explaining the first example of the embodiment related to the semiconductor device.

The embodiments of a semiconductor device and a display device according to the present invention will be described below in detail with reference to the drawings. In this regard, in the individual embodiments related to the semiconductor device, the configuration will be described following the order of the production steps.

<Semiconductor Device-1>

Initially, a first example of an embodiment related to a semiconductor device according to the present invention will be described with reference to FIG. 1 to FIG. 3.

First, as shown in FIG. 1 (1), an insulating substrate 1 is prepared. The material of this substrate 1 is not specifically limited and may be, for example, a hard material, e.g., glass, or be a soft plastic material, e.g., polyether sulfone (PES) or polyethylene naphthalate (PEN). Furthermore, the configuration, in which a protective film and a buffer layer are disposed on the above-described glass substrate or the plastic substrate, may be employed on the basis of the assumption of serving as a support substrate of individual members described below. For example, the configuration, in which a silicon nitride (SiNx) thin film is provided on a glass substrate for the purpose of serving as a gas barrier, and the configuration, in which a silicon nitride (SiNx) thin film, an acrylic thin film for surface protection or planarization, or the like is provided on a plastic film substrate, may be employed.

Next, a source electrode 3s and a drain electrode 3d are formed on the substrate 1. Patterning of the source electrode 3s and the drain electrode 3d is conducted by applying, for example, a printing method, e.g., an ink-jet method, a microcontact method, or a screen printing method, or a photolithography method.

For example, in order to form finer source electrode 3s and drain electrode 3d with high accuracy, it is preferable to conduct patterning by applying the lithography method. In this case, the electrode material layer formed into a film is subjected to pattern etching through the use of a resist pattern formed by the lithography method as a mask. As for the electrode material layer, materials having good electrical conductivity, for example, aluminum (Al), gold (Au), a laminated film of gold (Au) and chromium (Cr), silver (Ag), palladium (Pd), molybdenum (Mo), furthermore indium-tin oxide (ITO), or the like are used regardless of organic material/inorganic material, simple substance/compound, and the like. Moreover, these material films may have laminated structures.

Subsequently, as shown in FIG. 1 (2), an insulating partition wall 5 is formed on the substrate 1 provided with the source electrode 3s/drain electrode 3d. This partition wall 5 is formed having a first opening 5a and a second opening 5b. The first opening 5a is disposed having the shape reaching end portions of the source electrode 3s and the drain electrode 3d and the substrate 1 between these electrodes 3s and 3d. The second opening 5b is disposed in such a way as to reach at least one of the source electrode and the drain electrode 3d. Here, as an example, two second openings 5b reaching the source electrode 3s and the drain electrode 3d are shown in the drawing.

In this regard, it is important that this partition wall 5 is configured in such a way that a semiconductor layer formed in the following step is separated into an upper part and a lower part of the partition wall 5. Such a partition wall 5 has a film thickness sufficiently larger than that of the semiconductor layer, and side walls of the first opening 5a and the second opening 5b are specified to be vertical or more preferably have the shape of a reverse taper which is inclined in such a way that the opening diameter decreases in a direction toward the upper part of the opening.

The shapes of the side walls of the first opening 5a and the second opening 5b in the above-described partition wall 5 may be the shape of a reverse taper having an inclination angle kept at a nearly constant, as shown in FIG. 1 (3). Alternatively, as shown in FIG. 1 (4) and FIG. 1 (5), a partition wall 5 formed from a laminated film may have a configuration in which the lower film has a wider opening width. Alternatively, as shown in FIG. 1 (6), regarding the shapes of the side walls of the first opening 5a and the second opening 5b, merely the upper parts has the shape of a reverse taper insofar as the semiconductor layer formed next is separated into the upper part and the lower part of the partition wall 5.

Examples of methods for producing the above-described partition wall 5 include a method, in which a photosensitive resin is used and production is conducted through photopatterning, and a method, in which production is conducted by combining formation of an insulating thin film and etching. As for the insulating thin film, for example, resins, e.g., PMMA, and inorganic insulating films of silicon nitride (SiNx), silicon oxide (SiOx), and the like are used.

Then, regarding the partition wall 5 as shown in FIG. 1 (3), the partition wall 5 having the openings 5a and 5b with side walls in the shape of a reverse taper is formed by using the photosensitive resin and conducting lithography while the exposure condition is adjusted. Likewise, the partition wall having a multilayer structure, as shown in FIG. 1 (5) or (6), can be produced in the same manner. For example, in the case where this is realized by using the photosensitive resin, it is enough that a lower layer film serving as a first layer and a film of a layer thereon serving as a second layer are allowed to have different photosensitivity. Alternatively, the photosensitive resin may be used as the first layer, and a material capable of being patterned selectively relative to the photosensitive resin of the first layer may be used as the second layer. Furthermore, in the case where formation of an insulating thin film and etching are conducted in combination, it is enough that the first layer and the second layer are allowed to have the selectivity in etching.

After the above-described partition wall 5 is formed, as shown in FIG. 1 (7), a semiconductor layer 7 is formed from above the partition wall 5 and, thereby, a channel portion semiconductor layer 7a composed of the semiconductor layer 7 is formed on the bottom portion of the first opening 5a while being separated from the top of the partition wall 5. Here, for example, the semiconductor layer 7 is formed all over the substrate 1 by a vacuum evaporation method. Consequently, the semiconductor layer 7 in the shape of being separated from the semiconductor layer 7 on the partition wall 5 is thereby disposed on the bottom portion of the second opening 5b as well.

This semiconductor layer 7 is formed from an organic semiconductor, for example, pentacene, a thiophene oligomer, e.g., sexithiophene, and a polythiophene. Alternatively, in the case where a method, e.g., an ink-jet method, in which patterning and film formation can be conducted at the same time, is used, the semiconductor layer 7 may be formed selectively merely on the bottom surface of the first opening 5a in the partition wall 5, and this may serve as the channel portion semiconductor layer 7a.

Figure 3:
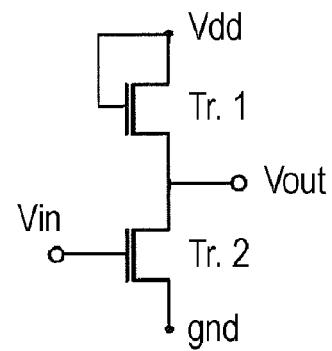
FIG. 3 is a circuit diagram of an inverter circuit.

Then, as shown in FIG. 2 (1), a gate insulating film 9 is formed all over the substrate 1, on which the semiconductor layer 7 has been formed. As for the gate insulating film 9, inorganic material films of silicon oxide, silicon nitride, and the like, and furthermore, organic material films of polyparaxylylene, polyvinyl alcohol, polyvinyl phenol, and furthermore polymethyl methacrylate (PMMA) are used.

Thereafter, as shown in FIG. 2 (2), connection holes 9a reaching the source electrode 3s and the drain electrode 3d are formed in the gate insulating film 9 and the semiconductor layer 7 on the bottom portion of the second openings 5b. Preferably, this connection hole 9a is formed at a position inside the second opening 5b in the partition wall 5 while being insulated from the semiconductor layer 7 on the partition wall 5. Such a connection holes 9a is formed through, for example, etching through the use of a resist pattern as a mask.

Next, as shown in FIG. 2 (3), a gate electrode 11a and wirings 11b are patterned on the gate insulating film 9. In this case, the gate electrode 11a is formed at a position overlapping the channel portion semiconductor layer 7a in the first opening 5a. Furthermore, individual wirings 11b connected to the source electrode 7s and the drain electrode 7d, respectively, through the connection holes 9a disposed in the bottom portions of the second openings 5b. Formation of these gate electrode 11a and wirings 11b is conducted in the same manner by using the same materials as those in the formation of the source electrode 3s and the drain electrode 3d.

As described above, a top gate•bottom contact type thin film transistor Tr is obtained, in which the gate electrode 11a is laminated on the channel portion semiconductor layer 7a, with the gate insulating film 9 therebetween, disposed in contact with the source electrode 3s and the drain electrode 3d. In addition, a semiconductor device 19-1 is obtained, in which the wirings 11b connected to the source electrode 3s and the drain electrode 3d of this thin film transistor Tr are led to the gate insulating film 9.

The semiconductor device 19-1 shown in the above-described drawings constitutes a part of, for example, an inverter circuit. Here, the inverter circuit is a basic circuit of a logic circuit and is formed from at least two transistors Tr1 and Tr2, as indicated by a circuit diagram shown in FIG. 3. Regarding formation of such an inverter circuit, gate electrodes, source electrodes, and drain electrodes of the individual transistors may be wired complicatedly.

Figure 4:
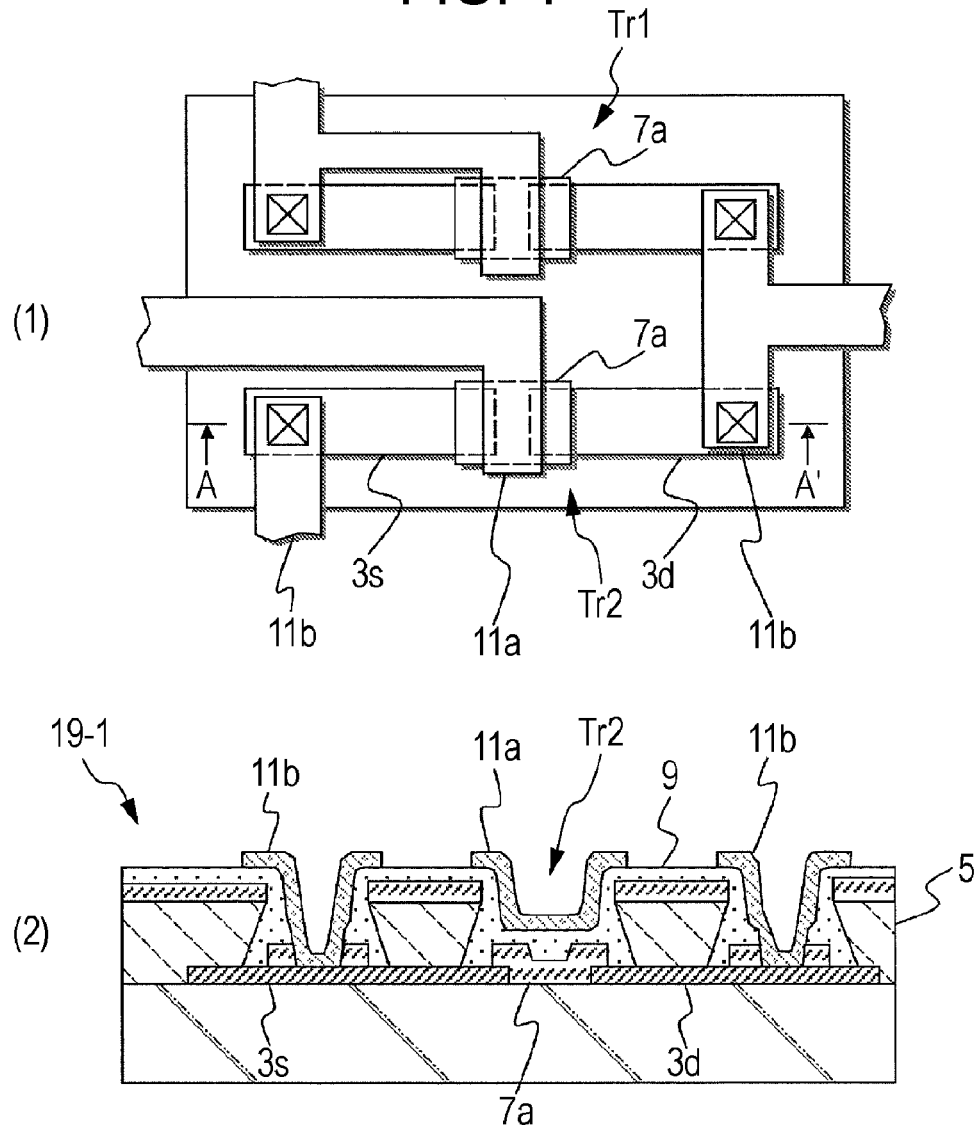
FIG. 4 is a diagram for explaining an inverter circuit, to which the first example of the embodiment is applied.

FIG. 4 (1) shows a plan configuration diagram of an inverter circuit formed by applying the configuration of the semiconductor device 19-1 produced following the procedure of the above-described embodiment. Furthermore, FIG. 4 (2) shows a sectional view of the section taken along a line A-A' [that is, FIG. 2 (3)] corresponding to this plan configuration diagram in combination.

In the case where the semiconductor device 19-1 according to the present embodiment is applied, as described above, an inverter circuit including a complicated wiring structure can be formed easily.

Figure 5:
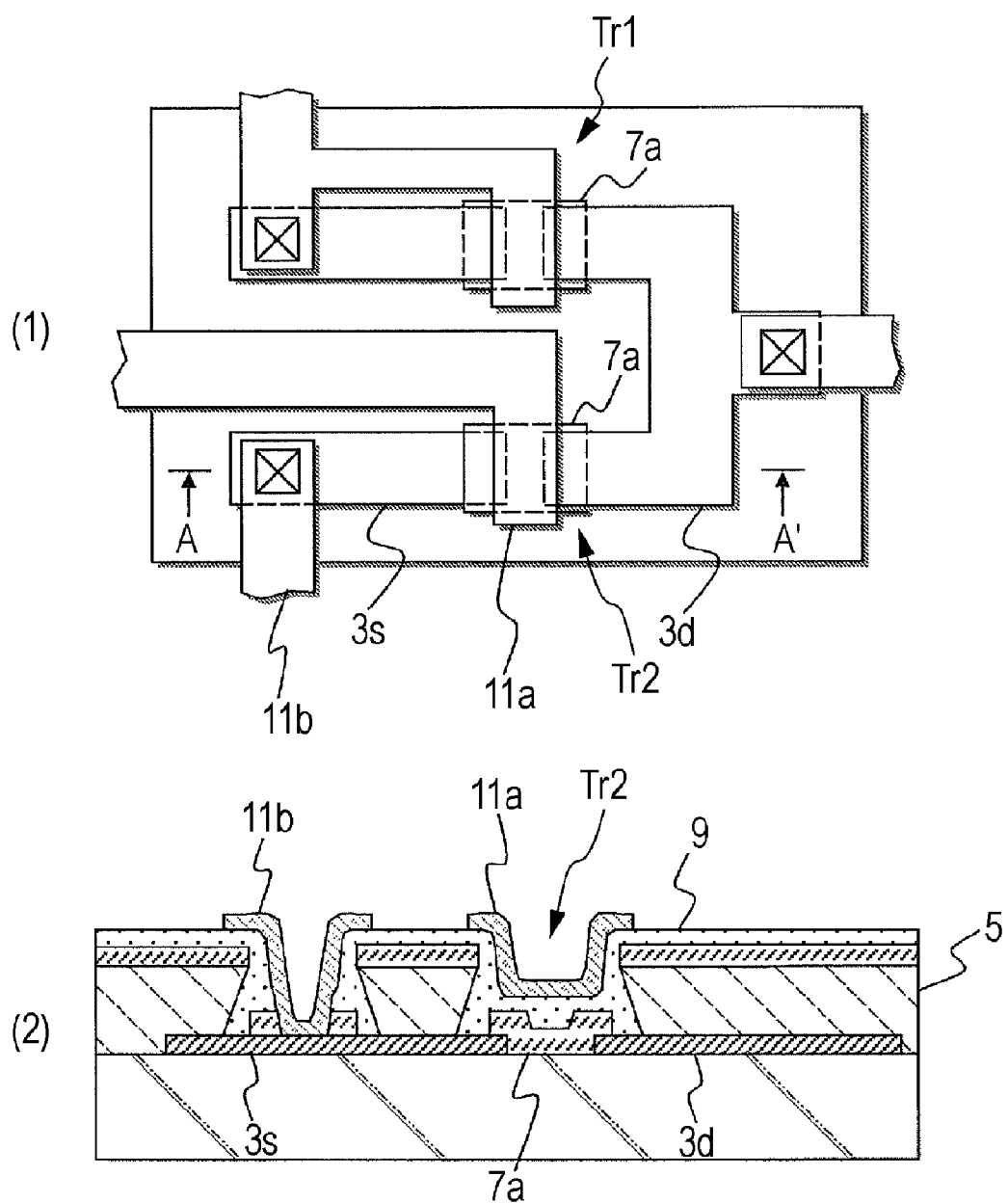
FIG. 5 is a diagram for explaining another inverter circuit, to which the first example of the embodiment is applied.

In this regard, the configuration of the inverter circuit is not limited to the configuration shown in FIG. 4. FIG. 5 (1) shows another example of the plan configuration diagram of the inverter circuit and FIG. 5 (2) shows a sectional view of the section taken along a line A-A' in this plan configuration diagram in combination. Regarding the above-described configuration shown in FIG. 5 as well, nearly the same operation can be realized, and production can be conducted in the same procedure as that explained in the embodiment. This refers to that the present invention has high versatility in circuit configuration. Incidentally, in FIG. 5, the same constituents as those in FIG. 4 are indicated by the same reference numerals as those set forth above.

In the semiconductor device 19-1 having the configuration obtained as described above, the channel portion semiconductor layer 7a is formed separately on the bottom portion of the first opening 5a through the use of the height difference of the patterned insulating partition wall 5. Therefore, it is possible to form finely.

Moreover, the semiconductor layer 7 constituting the channel portion semiconductor layer 7a is formed from above the partition wall 5 provided with the first opening 5a and the second opening 5b and, therefore, remains all over the surface while being separated into upper and lower parts of the height difference of the partition wall 5. Consequently, most of the gate insulating film 9 formed on the upper part is disposed on the semiconductor layer 7 including the channel portion semiconductor layer 7a and is formed with uniform film quality.

As a result of those described above, since the high-definition channel portion semiconductor layer 7a is provided, the element structure can be made finer. In addition, since the uniformly formed gate insulating film 9 is provided, leakage between the gate electrode 11a-wiring 11b formed on the gate insulating film 9 or between the gate electrode 11a or the wiring 11b and the semiconductor layer 7 disposed on and under the gate insulating film 9 is prevented, so that highly reliable semiconductor device 19-1 can be realized.

Furthermore, since the wiring 5a is routed on the insulating partition wall 5 in the structure, the parasitic capacitance between the wiring 11a and the source electrode 3s and the drain electrode 3d, which are the lower layers, can be reduced. Consequently, the speed of the operation of the semiconductor device 19-1 can increase.

Incidentally, the above-described individual layers are not limited to be formed from the above-described materials. Moreover, the individual layers may have multilayer structures composed of a plurality of materials insofar as the functions are not impaired. Examples thereof include introduction of an adhesive layer into the lower part of the electrode to ensure the adhesion to the base material, introduction of an etching stopper on the electrode, and introduction of a laminated metal structure to ensure the gas barrier property or ensure the ductility.

In addition, publicly known technologies can be used widely for formation of the individual layers. Etching and patterning technologies, for example, common film formation methods, e.g., vacuum evaporation, sputtering, and CVD, film formation methods, e.g., spin coating, cap coating, screen printing, and ink-jet printing, by using solutions, pattern transfer methods, e.g., a photolithography method, an electron beam lithography method, a microprinting method, and a nanoimprint method, a wet-etching method, a dry-etching method, lift off, and the like can be combined widely. As a matter of course, common semiconductor formation technologies, e.g., heating and cleaning, which are required in combination of the above-described methods, can be used.

Furthermore, the procedure explained in the above-described embodiment can produce a semiconductor device having another wiring configuration described below.

For example, regarding the configuration shown in FIG. 6 (1), in the step to form a gate electrode 11a and a wiring 11b, the gate electrode 11a may be patterned extending in such a way as to be connected to a source electrode 3s through a connection hole 9a and the wiring 11b may be patterned in such a way as to be connected to a drain electrode 3d through the other connection hole 9a.

Alternatively, regarding the configuration shown in FIG. 6 (2), in the step to form a partition wall 5, the partition wall 5 having merely a first opening 5a in the shape reaching end portions of the source electrode 3s and the drain electrode 3d and a substrate 1 between these electrodes 3s and 3d is formed. Then, merely a gate electrode 11a is formed on the gate insulating film 9. In this case, the source electrode 3s and the drain electrode 3d may be wired on the substrate 1 under the partition wall 5.

<Semiconductor Device-2>

Next, as for a second example of the embodiment related to the semiconductor device, a semiconductor device having a multilayer structure, in which an upper layer wiring is further disposed, will be described with reference to FIG. 7. Here, explanations of the same configurations as those in the first example will be omitted.

Initially, in a manner similar to that described in the first example with reference to FIG. 1 (1) to FIG. 2 (3), formation up to the gate electrode 11a and the wirings 11b on the gate insulating film 9 is conducted.

Thereafter, as shown in FIG. 7 (1), an interlayer insulating film 21 is formed while covering the gate electrode 11a and the wirings 11b, and individual connection holes 21a reaching the gate electrode 11a and the wirings 11b are formed in this interlayer insulating film 21.

The above-described interlayer insulating film 21 and connection holes 21a can be formed in a manner similar to the formation of the insulating partition wall 5 explained with reference to FIG. 1 (2). However, regarding the film formation of the interlayer insulating film 21, if formation through coating is conducted by, for example, a spin coating method, it is expected that unevenness of the base material surface is not a little planarized.

Subsequently, as shown in FIG. 7 (2), a second layer of wiring 23 connected to the gate electrode 11a and the wirings 11b through the connection holes 21a is patterned on the interlayer insulating film 21.

The formation of the above-described second layer of wiring 23 can be conducted in a manner similar to the formation of the source electrode 3s and the drain electrode 3d explained with reference to FIG. 1 (1) or the formation of the gate electrode 11a and the wirings 11b explained with reference to FIG. 2 (3).

After those described above, as shown in FIG. 7 (3), an interlayer insulating film 25 is further formed, connection holes 25a are formed, and a third layer of wiring 27 connected to the second layer of wiring 23 through the connection holes 25a is formed, as necessary. Moreover, a still upper layer of wiring may be formed, as necessary.

In the configuration of the semiconductor device 19-2 having the multilayer wiring structure obtained as described above, the channel portion semiconductor layer 7a is formed from above the partition wall 5 provided with the first opening 5a and the second opening 5b and is formed separately on the bottom portion of the first opening 5a through the use of the height difference of the partition wall 5. Therefore, the effects similar to those of the semiconductor device of the first example can be obtained. Furthermore, in particular, the semiconductor device 19-2 of the present second example has the multilayer wiring structure, in which the wiring 11b led from the bottom portion of the second opening 5b is further routed on the interlayer insulating film 21. Consequently, the circuit design can be conducted with high flexibility.

<Semiconductor Device-3>

Next, as for a third example of the embodiment related to the semiconductor device, another example of the semiconductor device having the multilayer structure will be described with reference to FIG. 8. Here, explanations of the same configurations as those in the first example and the second example will be omitted.

Initially, in a manner similar to that described in the first example with reference to FIG. 1 (1) to FIG. 2 (3), formation up to the gate electrode 11a and the wiring 11b on the gate insulating film 9 is conducted.

However, as shown in FIG. 8 (1), the partition wall 5 is provided with the first opening 5a and, in addition, merely the second opening 5b reaching the drain electrode 3d. After the semiconductor layer 7 is formed, the gate insulating film 9 is formed, and merely the connection hole 9a reaching the drain electrode 3d is formed. Subsequently, the gate electrode 11a and, in addition, merely the wiring 11b connected to the drain electrode 3d is formed. At this time, the gate electrode 11a is wired by being routed on the partition wall 5 with the gate insulating film 9 therebetween. In this regard, the source electrode 3s is wired by being routed on the substrate 1 under the partition wall 5.

Thereafter, as shown in FIG. 8 (2), the interlayer insulating film 21 is formed while covering the gate electrode 11a and the wiring 11b, and merely the connection hole 21a reaching the wiring 11b is formed in this interlayer insulating film 21.

Then, as shown in FIG. 8 (3), a second layer of wiring 23 connected to the wiring 11b through the connection hole 21a is patterned on the interlayer insulating film 21, and the second layer of wiring 23 connected to the drain electrode 3d is routed on the interlayer insulating film 21.

Regarding the semiconductor device 19-3 having the configuration obtained as described above, in the configuration, the channel portion semiconductor layer 7a is formed from above the partition wall 5 provided with the first opening 5a and the second opening 5b and is formed separately on the bottom portion of the first opening 5a through the use of the height difference of the partition wall 5. Therefore, the effects similar to those of the semiconductor device of the first example can be obtained. Furthermore, in particular, the semiconductor device 19-2 of the present third example has the multilayer wiring structure, in which the source electrode 3s is wired on the substrate 1, the gate electrode 11a is wired on the partition wall 5, and the source electrode 3d is wired on the interlayer insulating film 21. Consequently, the flexibility of the layout design of the individual electrodes and the wirings can be made higher than that in the second example.

<Semiconductor Device-4>

Figure 9:
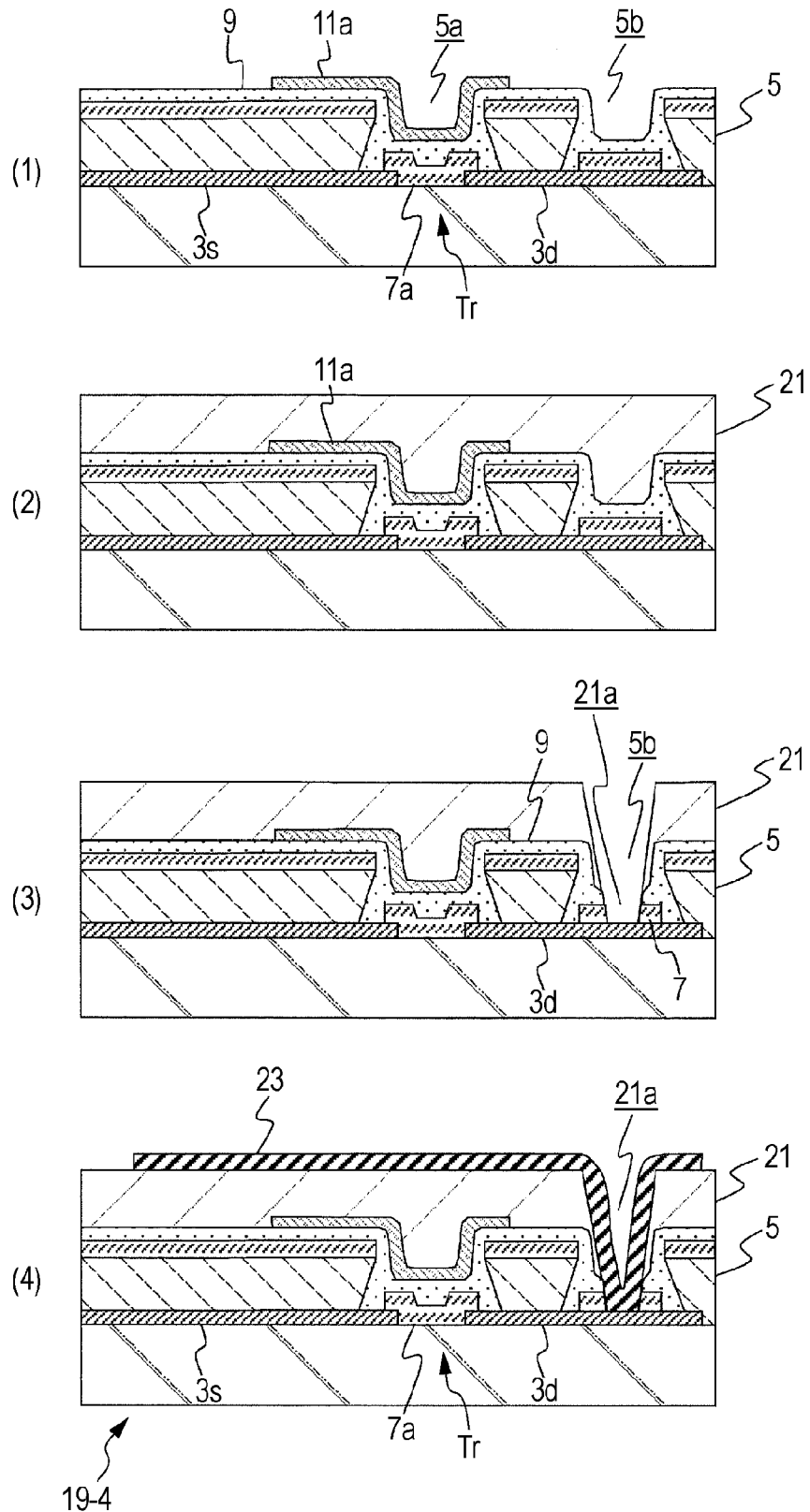
FIG. 9 is a sectional step diagram for explaining a fourth example of the embodiment related to the semiconductor device.

Next, as for a fourth example of the embodiment related to the semiconductor device, a modified example of the third example will be shown with reference to FIG. 9. Here, explanations of the same configurations as those in the first example and the second example will be omitted.

Initially, in a manner similar to that described in the first example with reference to FIG. 1 (1) to FIG. 2 (3), formation up to the gate electrode 11a on the gate insulating film 9 is conducted.

However, as shown in FIG. 9 (1), the partition wall 5 is provided with the first opening 5a and, in addition, the second opening 5b reaching the drain electrode 3d. After the semiconductor layer 7 is formed, the gate insulating film 9 is formed. Subsequently, merely the gate electrode 11a is formed on the gate insulating film 9. At this time, the gate electrode 11a is wired by being routed on the partition wall 5 with the gate insulating film 9 therebetween. In this regard, the source electrode 3s is wired by being routed on the substrate 1 under the partition wall 5.

Thereafter, as shown in FIG. 9 (2), the interlayer insulating film 21 is formed while covering the gate electrode 11a.

Then, as shown in FIG. 9 (3), the connection hole 21a reaching the drain electrode 3d is formed in the interlayer insulating film 21, the gate insulating film 9, and the semiconductor layer 7 on the bottom portion of the second opening 5b.

Subsequently, as shown in FIG. 9 (4), the wiring 23 connected to the drain electrode 3d through the connection hole 21a is routed on the interlayer insulating film 21.

Regarding the semiconductor device 19-4 having the configuration obtained as described above, in the configuration, the channel portion semiconductor layer 7a is formed from above the partition wall 5 provided with the first opening 5a and the second opening 5b and is formed separately on the bottom portion of the first opening 5a through the use of the height difference of the partition wall 5, and furthermore, the multilayer wiring structure is formed, in which the source electrode 3s is wired on the substrate 1, the gate electrode 11a is wired on the partition wall 5, and the source electrode 3d is wired on the interlayer insulating film 21. Therefore, the effects similar to those of the third example can be obtained.

<Semiconductor Device-5>

Next, as for a fifth example of the embodiment related to the semiconductor device, a semiconductor device, in which the gate insulating film has a laminated structure, will be described with reference to FIG. 10. Here, the fifth example is explained as a modified example of the first example, and explanations of the same configurations as those in the first example will be omitted.

Initially, in a manner similar to that described in the first example with reference to FIG. 1 (1) to FIG. 1 (7), formation up to the semiconductor layer 7 including the channel portion semiconductor layer 7a through film formation from above the partition wall 5 is conducted.

Figure 10:
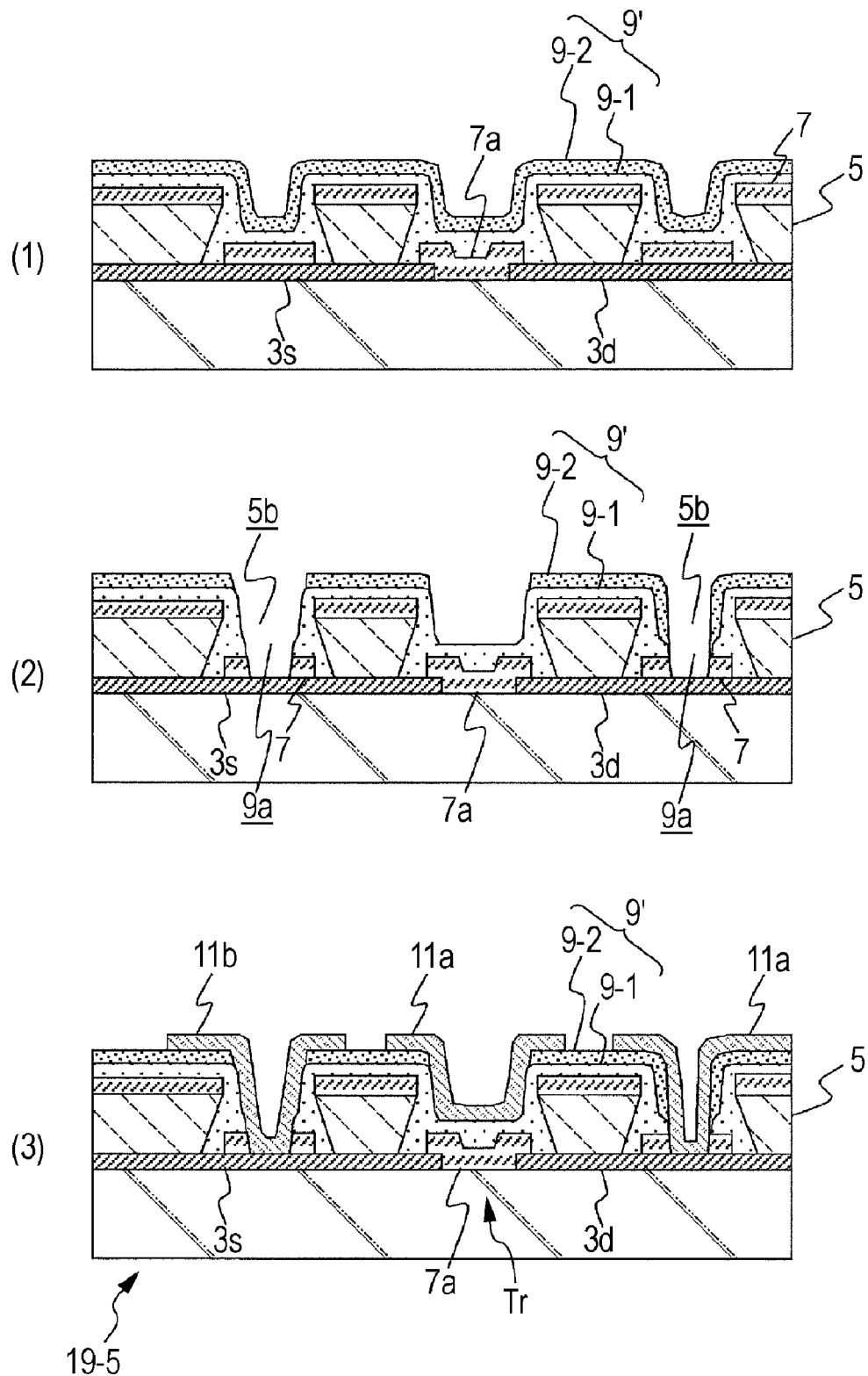
FIG. 10 is a sectional step diagram for explaining a fifth example of the embodiment related to the semiconductor device.

Then, as shown in FIG. 10 (1), a gate insulating film 9' having a laminated structure is formed all over the substrate 1, on which the semiconductor layer 7 has been formed. As for an example of such a gate insulating film 9', a two-layer structure of a lower layer insulating film 9-1, which can be formed with low damage to the semiconductor layer 7 formed from the organic material, and an upper layer insulating film 9-2, which is formed from a material exhibiting good characteristics as the gate insulating film, is shown.

Examples of the lower layer insulating film 9-1, which can be formed with low damage to the semiconductor layer 7 formed from the organic material, include polyparaxylylene and related substances thereof, polyvinyl alcohol, and lithium fluoride. The film thickness of the above-described lower layer insulating film 9-1 may be a very small about 0.1 nm insofar as the film thickness is such that the influence in the film formation of the upper layer insulating film 9-2 on the lower layer insulating film 9-1 is not exerted on the semiconductor layer 7 serving as the base material. Examples of the above-described thin-film shaped lower layer insulating film 9-1 include self-organization monomolecular films of silane coupling agent and the like, which are formed in a vacuum.

Furthermore, examples of the upper layer insulating film 9-2, which is formed from a material exhibiting good characteristics as the gate insulating film, include metal oxide films, such as, silicon nitride (SiNx), titanium oxide (TiO2), and hafnium oxide (HfOx), as materials having high dielectric constants, for example.

Thereafter, the same procedure as that in the first example is executed.

That is, as shown in FIG. 10 (2), connection holes 9a reaching the source electrode 3s and the drain electrode 3d are formed in the gate insulating film 9' and the semiconductor layer 7 on the bottom portion of the second openings 5b.

Subsequently, as shown in FIG. 10 (3), the gate electrode 11a and the wiring 11b are patterned on the gate insulating film 9'.

As described above, a top gate•bottom contact type thin film transistor Tr is obtained, in which the gate electrode 11a is disposed on the channel portion semiconductor layer 7a disposed in contact with the source electrode 3s and the drain electrode 3d with the gate insulating film 9' having the laminated structure therebetween. In addition, a semiconductor device 19-5 is obtained, in which the wirings 11b connected to the source electrode 3s and the drain electrode 3d of this thin film transistor Tr are led to the gate insulating film 9'.

The semiconductor device 19-5 having the configuration obtained as described above corresponds to the semiconductor device having the configuration of the first example, in which the gate insulating film 9' is specified to have the laminated structure. Then, the lower layer insulating film 9-1, which is composed of a material capable of being formed with low damage to the semiconductor layer 7 serving as a base material, and the upper layer insulating film 9-2, which is composed of a material suitable for the gate insulating film, are laminated and, thereby, the gate insulating film 9' having desired characteristics can be disposed without deterioration of the film quality of the channel portion semiconductor layer 7a. Consequently, the transistor operation can be improved.

Here, insulating film materials, which can be formed directly on the semiconductor layer 7 formed from the organic material with low damage, are limited to several types at present. In the case where they are used, good transistor characteristics are not always obtained. In particular, these insulating films have low dielectric constants in many cases, and the gate voltage cannot be reflected on the transistor operation effectively. Hence, as in the present fifth example, in the case where once the lower layer insulating film 9-1, which can be formed directly on the semiconductor layer 7 formed from the organic material, is made into a film, the upper layer insulating film 9-2, which is formed thereon, can be made into a film without coming into direct contact with the semiconductor layer 7. Therefore, the upper layer insulating film 9-2 formed from various materials having good characteristics can be disposed without damaging the semiconductor layer 7 directly. Consequently, it is possible to increase the types of insulating films usable as the gate insulating film 9' and improve the flexibility in material selectivity.

Incidentally, the gate insulating film 9' is not limited to the laminated structure of two layers and may be a laminated structure of at least three layers. For example, regarding the three-layer structure, an insulating layer to ensure the adhesion to the metal layers constituting the gate electrode 11a and the wirings 11b in the upper part may be further disposed on the above-described upper layer insulating film 9-2.

In addition, such a configuration, in which the gate insulating film 9' having the laminated structure is disposed, can be combined with the semiconductor devices having the configurations shown in the second to the fourth examples, and similar effects can be obtained.

<Semiconductor Device-6>

Next, as for a sixth example of the embodiment related to the semiconductor device, a semiconductor device including a thin film transistor having a double gate structure will be described with reference to FIG. 11. Here, the sixth example is explained as a modified example of the first example, and explanations of the same configurations as those in the first example will be omitted.

Initially, a first gate electrode 31 is formed on the substrate 1. The formation of the first gate electrode 31 is conducted by applying the printing method, e.g., the ink-jet method, the microcontact method, or the screen printing method, or the photolithography method, in a manner similar to the formation of the source electrode 3s and the drain electrode 3d explained in the first example.

Thereafter, a first gate insulating film 33 is formed while covering the first gate electrode 31. As for the formation of the first gate insulating film 33, an inorganic material film or an organic material film is used as in the formation of the gate insulating film 9 explained in the first example. In this regard, the first gate insulating film 33 may has a laminated structure.

After those described above, the same procedure as that explained in the first example with reference to FIG. 1 (1) to FIG. 2 (3) is executed and, thereby, the source electrode and the drain electrode 3d are formed on the first gate insulating film 33, and furthermore, formation of the partition wall 5, formation of the semiconductor layer 7, formation of the gate insulating film (second gate insulating film) 9, and formation of the gate electrode (second gate electrode) 11a and the wirings 11b are conducted.

As described above, a thin film transistor Tr' having a double gate structure is obtained, in which the channel portion semiconductor layer 7a disposed in contact with the source electrode 3s and the drain electrode 3d is sandwiched by the two gate electrodes 11a and 31 with the gate insulating films 9 and 33 therebetween. In addition, a semiconductor device 19-6 is obtained, in which the wirings 11b connected to the source electrode 3s and the drain electrode 3d of this thin film transistor Tr' are led to the gate insulating film 9.

Even the semiconductor device 19-6 having the configuration obtained as described above, the effects similar to those of the first example can be obtained.

In addition, such a double gate structure can be combined with the semiconductor devices having the configurations shown in the second example to the fifth example, and similar effects can be obtained.

Furthermore, in the case where an inverter circuit indicated by a circuit diagram shown in FIG. 12 (1) is formed by using the transistor having the above-described double gate structure, FIG. 12 (2) shows an example of a sectional configuration. That is, one transistor Tr1' of at least two p-type transistors Tr1' and Tr2' constituting the inverter circuit connects the gate electrode 11a to the drain electrode 3d and, in addition, connects the lower layer first gate electrode 31 to the drain 3d through a connection hole formed in the lower layer first gate insulating film 33. Moreover, in the configuration, the source electrode 3s of this transistor Tr1' is shared with the drain electrode 3d of the other transistor Tr2'.

<Liquid Crystal Display Device-1>

Next, as for a first example related to a display device according to the present invention, a liquid crystal display device will be described with reference to FIG. 13 to FIG. 15.

Figure 13:
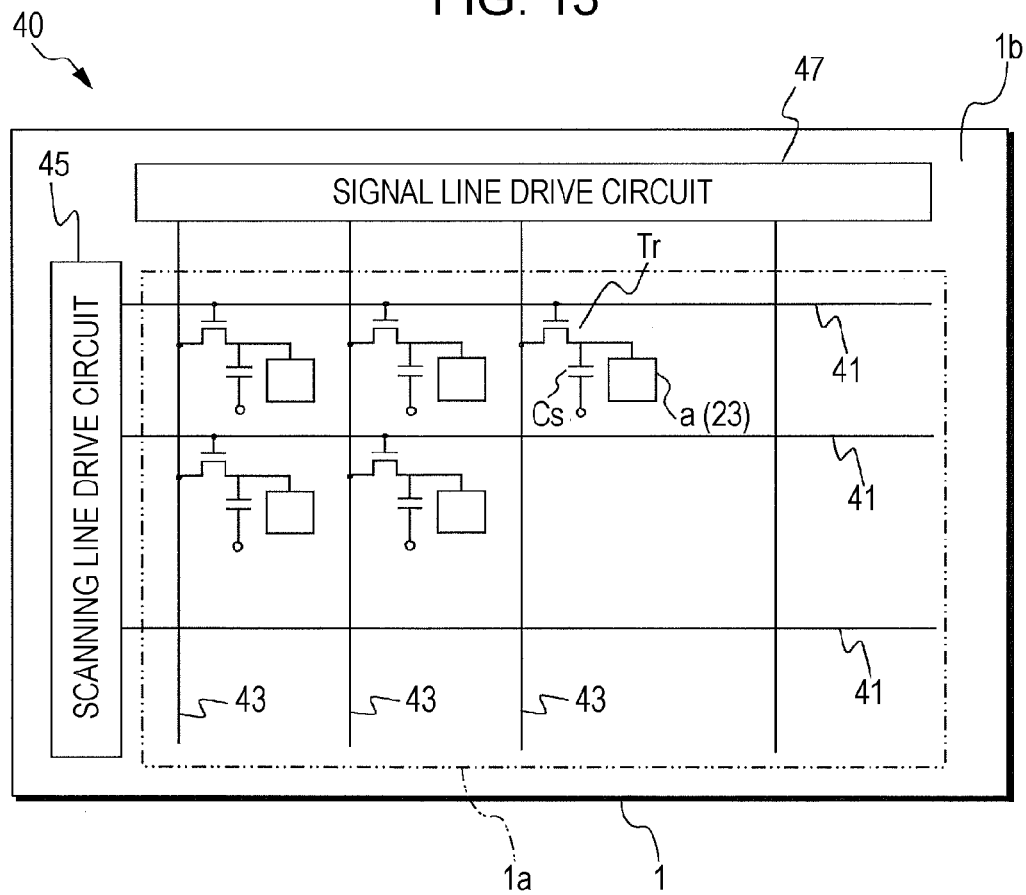
FIG. 13 is a diagram showing the circuit configuration of a liquid crystal display device explained in an embodiment.

FIG. 13 is a schematic circuit configuration diagram for explaining a configuration example of a liquid crystal display device. As shown in this drawing, a display region 1a and a peripheral region 1b thereof are set on a substrate 1 of a liquid crystal display device 40. In the display region 1a, a plurality of scanning lines 41 and a plurality of signal lines 43 are wired vertically and horizontally, and a pixel array portion is formed, in which one pixel corresponds to each of intersections. Furthermore, in the peripheral region 1b, as necessary, a scanning line drive circuit 45 to drive the scanning of the scanning lines 41 and a signal line drive circuit 47 to supply image signals (that is, input signals) in accordance with the brightness information to the signal lines 43 may be disposed. Alternatively, the drive circuit may be attached to the display device externally.

The pixel circuit disposed at each intersection of the scanning lines 41 and the signal lines 43 is formed from, for example, a thin film transistor Tr, a retention capacity Cs, and a pixel electrode a. Then, the image signal written from the signal lines 43 through the thin film transistor Tr is held by the retention capacity Cs on the basis of driving by the scanning line drive circuit 45, the voltage in accordance with the amount of held signal is supplied to the pixel electrode a, and liquid crystal molecules constituting a liquid crystal layer are inclined in accordance with this voltage, so that transmission of display light is controlled.

In this regard, the above-described configuration of the pixel circuit is no more than an example. As necessary, a capacitive element may be disposed in the pixel circuit, and furthermore, the pixel circuit may be formed by disposing a plurality of transistors. Moreover, necessary drive circuits are added to the peripheral region 1b in accordance with changes in the pixel circuit.

Figure 14:
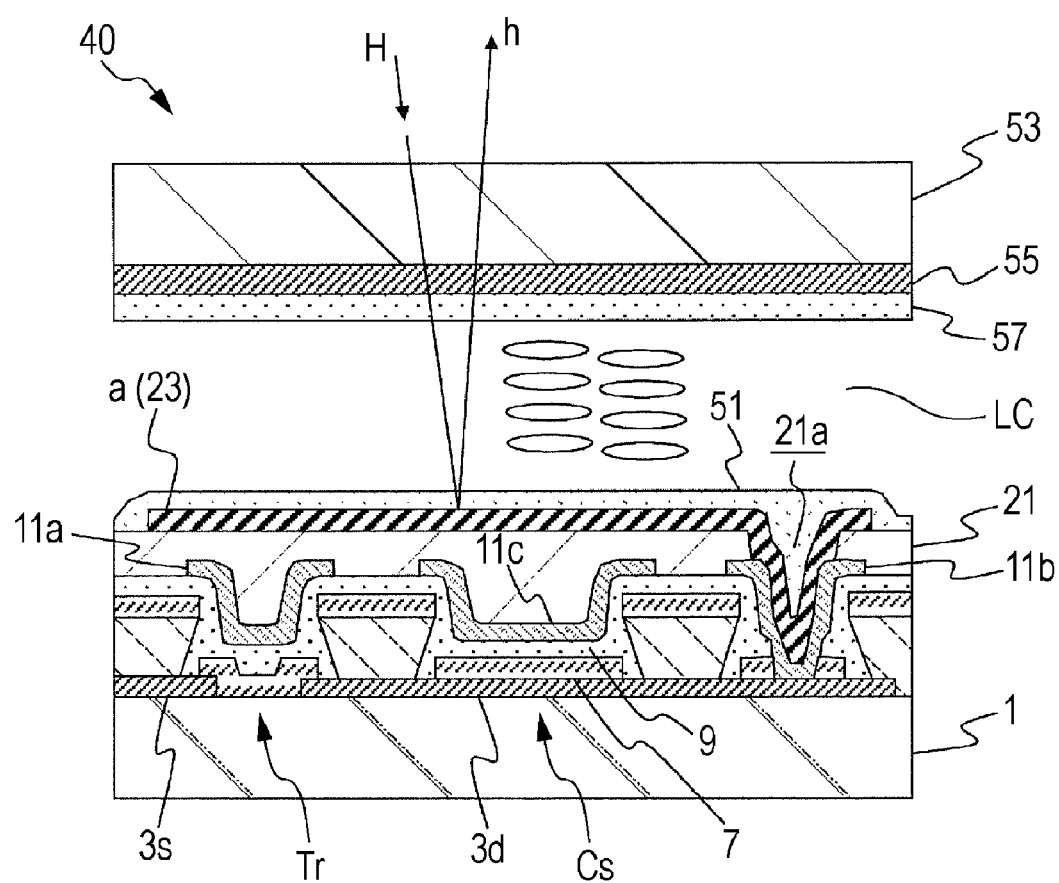
FIG. 14 is a sectional view of a key portion for explaining an embodiment related to a liquid crystal display device, to which the present invention is applied.
Figure 15:
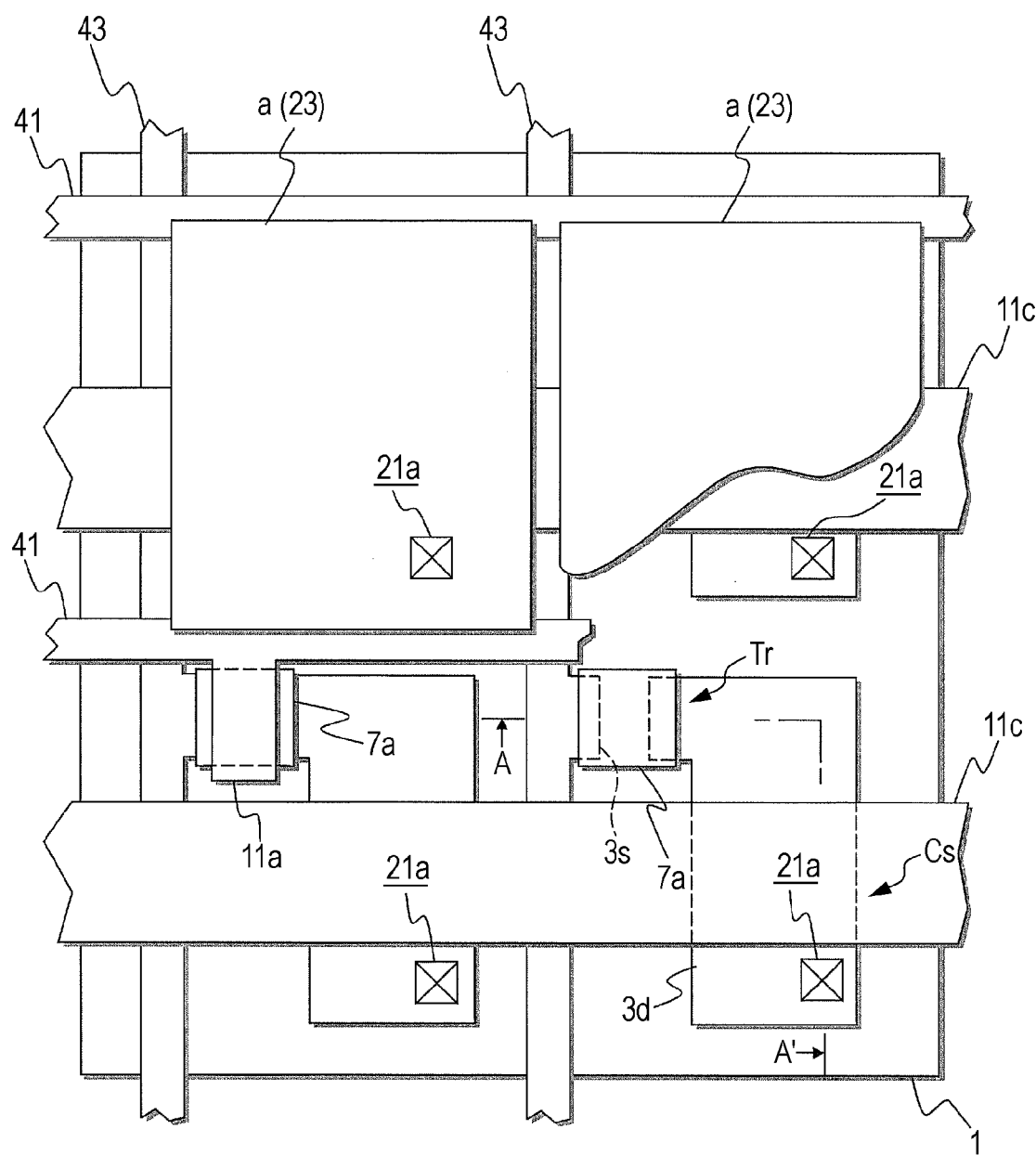
FIG. 15 is four pixels of plan view on the drive substrate side in the liquid crystal display device shown in FIG. 14.

FIG. 14 shows one pixel of sectional view for explaining a characteristic portion of the liquid crystal display device 40 of the present embodiment. Furthermore, FIG. 15 shows four pixels of cutaway plan view. In this regard, the sectional view shown in FIG. 14 corresponds to the section taken along a line A-A' shown in FIG. 15.

The liquid crystal display device 40 shown in these drawings includes a drive substrate formed by applying the above-described semiconductor device according to the present invention. Here, as an example, the semiconductor device of the third example explained with reference to FIG. 8 is applied.

That is, in the liquid crystal display device 40, the second layer of wiring 23 wired on the interlayer insulating film 21 is used as the pixel electrode a. Moreover, an extended portion of the drain electrode 3d of the thin film transistor Tr serves as a lower electrode, a wiring formed from the same layer as the gate electrode 11a serves as an upper electrode 11c, and the gate insulating film 9 and the semiconductor layer 7 serving as a dielectric are held between them so as to constitute the retention capacity Cs.

Then, an alignment film 51 is disposed while covering a plurality of pixel electrodes a arranged in the matrix on the interlayer insulating film 21 so as to constitute the drive substrate.

A counter substrate 53 is disposed on the alignment film 51 side of the above-described drive substrate. This counter substrate 53 is formed from a transparent substrate, such as, a glass substrate, and a counter electrode 55 and an alignment film 57, which are common to all pixels, are disposed in that order toward the drive substrate side. In this regard, as for constituent materials on the above-described counter substrate 53 side, constituent materials for a general liquid crystal display device may be applied.

In addition, a spacer, although not shown in the drawing here, is held between the alignment films 51-57 formed on the above-described drive substrate and the counter substrate 53, and furthermore, a liquid crystal layer LC is filled and sealed, so that the liquid crystal display device 40 is formed. Incidentally, although not clearly shown in the drawing, a part, e.g., an antireflection film, having a function of suppressing the reflection of external light may be present on, for example, the outside surface of the counter substrate 53. In this case, the part having that function may be formed and, thereafter, an assembling step, in which the spacer is held between the alignment films 51-57 and the liquid crystal layer LC is filled and sealed, may be conducted. Furthermore, as necessary, a color filter layer may be disposed on the counter substrate 53 side.

According to the above-described liquid crystal display device 40, the pixel circuit is formed by using the semiconductor device of the third example. That is, in the configuration, the channel portion semiconductor layer 7a is formed from above the partition wall 5 provided with the first opening 5a and the second opening 5b and is formed separately on the bottom portion of the first opening 5a through the use of the height difference of the partition wall 5. Consequently, the pixel aperture ratio can be increased through reduction in pixel area or reduction in distance between pixels by using the thin film transistor Tr, which is made finer while high reliability is provided, for the pixel circuit.

Moreover, the pixel electrode a connected to the drain electrode 3d is led to the interlayer insulating film 21. Therefore, in the case where this pixel electrode a is formed from a reflective material, when the external light H incident from the counter substrate 53 side is modulated by the liquid crystal layer LC and is reflected at the pixel electrode a so as to be displayed as the display light h, coloring of the display light h under the influence of the partition wall 5 and the semiconductor layer 7 is prevented. Consequently, the image quality of the liquid crystal display device 40 can be improved.

Incidentally, the configuration of the above-described drive substrate is not limited to the drive substrate in the liquid crystal display device. It is possible to apply as the drive substrate in an electrophoretic display device, and similar effects can be obtained.

<Organic EL Display Device>

Next, as for a second example related to the display device according to the present invention, an organic EL display device will be described with reference to FIGS. 16 and 17.

Figure 16:
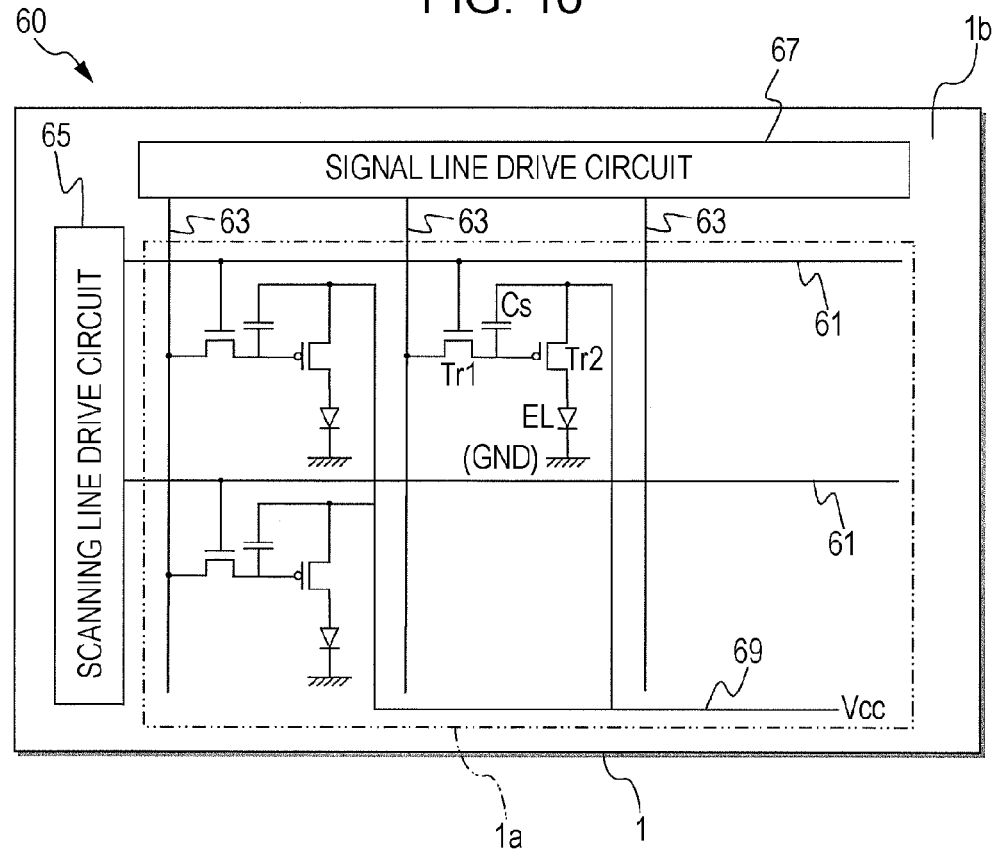
FIG. 16 is a diagram showing the circuit configuration of an organic EL display device explained in an embodiment.

FIG. 16 is a schematic circuit configuration diagram for explaining a configuration example of an organic EL display device. As shown in this drawing, a display region 1a and a peripheral region 1b thereof are set on a substrate 1 of an organic EL display device 60. In the display region 1a, a plurality of scanning lines 61 and a plurality of signal lines 63 are wired vertically and horizontally, and a pixel array portion is formed, in which one pixel corresponds to each of intersections. Furthermore, in the peripheral region 1b, as necessary, a scanning line drive circuit 65 to drive the scanning of the scanning lines 61 and a signal line drive circuit 67 to supply image signals (that is, input signals) in accordance with the brightness information to the signal lines 63 may be disposed. Alternatively, the drive circuit may be attached to the display device externally.

The pixel circuit disposed at each intersection of the scanning lines 61 and the signal lines 63 is formed from, for example, a thin film transistor Tr1 for switching, a thin film transistor Tr2 for driving, a retention capacity Cs, and an organic electroluminescent element EL. Then, the image signal written from the signal lines 63 through the thin film transistor Tr1 for switching is held by the retention capacity Cs on the basis of driving by the scanning line drive circuit 65, the current in accordance with the amount of held signal is supplied to the organic electroluminescent element EL from the thin film transistor Tr2 for driving, and the organic electroluminescent element EL emits light at brightness in accordance with this current value. Incidentally, the thin film transistor Tr2 for driving and the retention capacity Cs are connected to a common power supply line (Vcc) 69.

In this regard, the above-described configuration of the pixel circuit is no more than an example. As necessary, a capacitive element may be disposed in the pixel circuit, and furthermore, the pixel circuit may be formed by disposing a plurality of transistors. Moreover, necessary drive circuits are added to the peripheral region 1b in accordance with changes in the pixel circuit.

Figure 17:
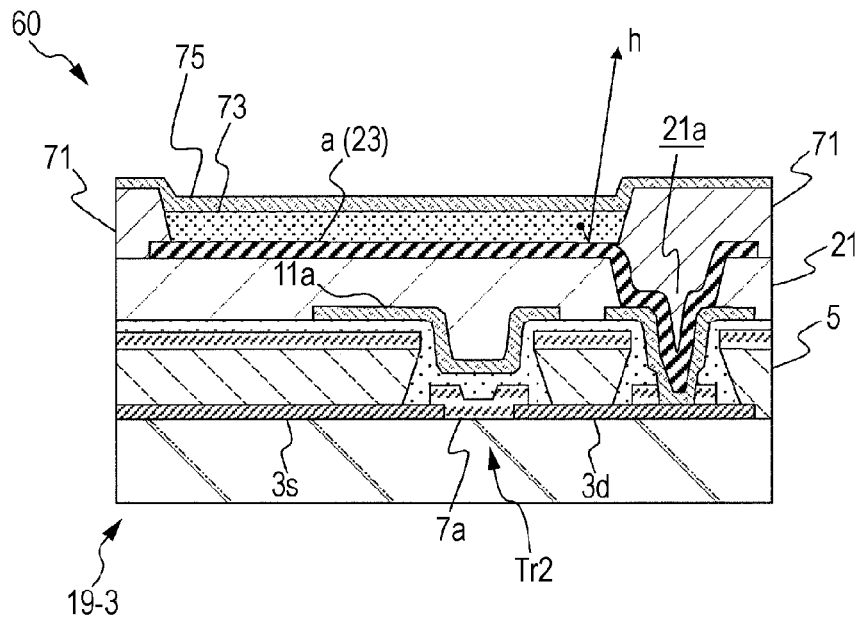
FIG. 17 is a sectional view of a key portion for explaining an embodiment related to an organic EL display device, to which the present invention is applied.

FIG. 17 shows one pixel of sectional view for explaining a characteristic portion of the organic EL display device 60 of the present embodiment. The organic EL display device 60 shown in this drawing includes the display device according to the present invention as a drive substrate. Here, as an example, the semiconductor device of the third example explained with reference to FIG. 8 is applied.

That is, in the organic EL display device 60, two thin film transistors Tr1 and Tr2 are disposed on the substrate 1, and the second layer of wiring 23 connected to the thin film transistor Tr2 for driving is used as the pixel electrode a.

These individual pixel electrodes a are dielectrically isolated by dielectric isolation portions 71. Regarding the formation of such a dielectric isolation portion 71, it is desirable to use a photosensitive resin, although not specifically limited, considering that the production process can be simplified, and a side wall in a gentle, normally tapered shape can be obtained, and publicly known insulating materials and a working method therefor can be used widely.

Then, an organic EL layer 73 is disposed on the plurality of pixel electrodes a arranged in the matrix on the interlayer insulating film 21, and a counter electrode 75 is disposed on the organic EL layer 73. This counter electrode 75 is disposed as an electrode common to all pixels. Here, in the case where the pixel electrode a is used as a positive electrode, the counter electrode 75 is formed as a negative electrode. On the other hand, in the case where the pixel electrode a is used as a negative electrode, the counter electrode 75 is formed as a positive electrode.

According to the above-described organic EL display device 60, the pixel circuit is formed by using the semiconductor device of the third example. That is, in the configuration, the channel portion semiconductor layer 7a is formed from above the partition wall 5 provided with the first opening 5a and the second opening 5b and is formed separately on the bottom portion of the first opening 5a through the use of the height difference of the partition wall 5. Consequently, the pixel aperture ratio can be increased through reduction in pixel area or reduction in distance between pixels by using the thin film transistor Tr, which is made finer while high reliability is provided, for the pixel circuit.

Moreover, the pixel electrode a is led higher than the semiconductor layer 7. Therefore, in the case where this pixel electrode a is formed from a reflective material, when the emitted light generated from the organic EL layer 73 is reflected at the pixel electrode a so as to be displayed as the display light h, coloring of the display light h under the influence of the partition wall 5 and the semiconductor layer 7 is prevented. Consequently, the image quality of the organic EL display device 60 can be improved.

The invention claimed is:

1. A semiconductor device comprising:
   a source electrode and a drain electrode on a substrate;
   an insulating partition wall on the substrate and which has
      (a) a first opening between the source electrode and the drain electrode, the first opening reaching the substrate, and (b) second openings at the center portion of the source electrode and the center portion of the drain electrode, the second openings reaching the source electrode and the drain electrode;
   a channel portion semiconductor layer on the bottom portion of the first opening;
   a gate insulating film on the partition wall in such a way as to cover the first opening including the channel portion semiconductor layer and the second openings; and
   a gate electrode on the gate insulating film while overlapping the channel portion semiconductor layer.

2. The semiconductor device according to claim 1, comprising a semiconductor layer on the partition wall.

3. The semiconductor device according to claim 2, comprising:
   connection holes which reach the source electrode or the drain electrode while insulation from the semiconductor layer on the partition wall is maintained, and which are disposed in the gate insulating film and the semiconductor layer on the bottom portion of the second openings; and
   wirings on the gate insulating film and connected to the source electrode or the drain electrode through the connection holes.

4. The semiconductor device according to claim 2, comprising:
   an interlayer insulating film on the gate insulating film provided with the gate electrode thereon, and
   wirings on the interlayer film and connected to the source electrode or the drain electrode through the connection holes disposed in the second openings while remaining insulated from the semiconductor layer on the partition wall.

5. The semiconductor device according to claim 1, characterized in that the gate insulating film comprises a laminated film.

6. The semiconductor device according to claim 1, characterized in that the semiconductor layer comprises an organic material.

7. A method for manufacturing a semiconductor device, comprising the steps of:
forming a source electrode and a drain electrode on a substrate;
forming an insulating film on the substrate in such a way as to cover the source electrode and the drain electrode;
forming a partition wall structure composed of the insulating film by forming a first opening in the insulating film between the source electrode and the drain electrode, the first opening reaching the substrate, and forming second openings in the insulating film at the center portion of the source electrode and the center portion of the drain electrode, the second openings reaching the source electrode and the drain electrode;
forming a channel portion semiconductor layer composed of a semiconductor layer on the bottom portion of the first opening in such a way as to separate from the top of the partition wall through film formation of the semiconductor layer from above the partition wall;
forming a gate insulating film on the partition wall in such a way as to cover the first opening including the channel portion semiconductor layer and the second openings; and
forming a gate electrode on the gate insulating film in such a way as to oppose to the channel portion semiconductor layer.

8. A display device characterized by comprising:
a source electrode and a drain electrode on a substrate;
an insulating partition wall on the substrate and having (a) a first opening between the source electrode and the drain electrode, the first opening reaching the substrate, and (b) second openings at the center portion of the source electrode and the center portion of the drain electrode, the second openings reaching the source electrode and the drain electrode;
a channel portion semiconductor layer on the bottom portion of the first opening;
a gate insulating film on the partition wall in such a way as to cover the first opening including the channel portion semiconductor layer and the second openings;
a gate electrode on the gate insulating film while overlapping the channel portion semiconductor layer; and
an interlayer insulating film covering the gate insulating film and the gate electrode, wherein;
pixel electrodes connected to the source electrode or the drain electrode through the connection holes disposed in the second openings are on the interlayer insulating film while remaining insulated from the semiconductor layer on the partition wall.

9. A display device according to claim 8, characterized in that the pixel electrode comprises a reflective material.

10. A method for manufacturing a display device, comprising the steps of:
forming a source electrode and a drain electrode on a substrate;
forming an insulating film on the substrate in such a way as to cover the source electrode and the drain electrode;
forming a first opening between the source electrode and the drain electrode, the first opening reaching the substrate;
forming second openings at the center portion of the source electrode and the center portion of the drain electrode, the second openings reaching the source electrode and the drain electrode;
forming a channel portion semiconductor layer composed of a semiconductor layer on the bottom portion of the first opening in such a way as to separate from the top of the partition wall through film formation of the semiconductor layer from above the partition wall;
forming a gate insulating film on the partition wall in such a way as to cover the first opening including the channel portion semiconductor layer and the second openings;
forming a gate electrode on the gate insulating film in such a way as to oppose to the channel portion semiconductor layer;
forming an interlayer insulating film covering the gate insulating film and the gate electrode; and
forming pixel electrodes connected to the source electrode or the drain electrode through the connection holes disposed in the second openings on the interlayer insulating film while maintaining insulation from the semiconductor layer on the partition wall.

\* \* \* \* \*